(12) United States Patent
Dornisch

(10) Patent No.: US 6,255,192 B1
(45) Date of Patent: Jul. 3, 2001

(54) METHODS FOR BARRIER LAYER FORMATION

(75) Inventor: Dieter Dornisch, Carlsbad, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/163,135

(22) Filed: Sep. 29, 1998

(51) Int. Cl.$^7$ ................................................. H01L 21/76
(52) U.S. Cl. ............................................. 438/430; 257/773
(58) Field of Search ........................... 257/773; 438/430

(56) References Cited

U.S. PATENT DOCUMENTS

| | | |
|---|---|---|
| 4,574,095 | 3/1986 | Baum et al. . |
| 5,010,378 * | 4/1991 | Douglas .................................. 357/55 |
| 5,354,712 | 10/1994 | Ho et al. . |
| 5,374,849 * | 12/1994 | Tada ..................................... 257/751 |
| 5,572,072 | 11/1996 | Lee . |
| 5,578,872 * | 11/1996 | Chen et al. ........................... 257/751 |
| 5,608,264 * | 3/1997 | Gaul ..................................... 257/374 |
| 5,654,232 | 8/1997 | Gardner . |
| 5,674,787 | 10/1997 | Zhao et al. . |
| 5,741,626 * | 4/1998 | Jain et al. ............................. 438/598 |
| 5,770,519 | 6/1998 | Klein et al. . |
| 5,780,358 | 7/1998 | Zhou et al. . |
| 5,798,569 * | 8/1998 | Miyazaki et al. ..................... 257/763 |
| 5,886,411 * | 3/1999 | Kohyama ............................. 257/774 |
| 5,892,282 * | 4/1999 | Hong et al. .......................... 257/751 |

FOREIGN PATENT DOCUMENTS

| | | |
|---|---|---|
| 0 305 143 A2 | 8/1988 | (EP) . |
| 0 841 690 A1 | 11/1996 | (EP) . |

* cited by examiner

*Primary Examiner*—Charles Bowers
*Assistant Examiner*—David S Blum
(74) *Attorney, Agent, or Firm*—Snell & Wilmer, LLP

(57) ABSTRACT

An improved microelectronic device and methods for forming the device are disclosed. The device includes a conductive feature formed on a semiconductor wafer by creating a trench within an insulating material, depositing barrier material substantially only within the trench, depositing conductive material on the wafer surface and within the trench, and removing the conductive material from the wafer surface. Alternately, the barrier material may be deposited onto the wafer surface and the trench and removed from the wafer surface prior to conductive material deposition.

15 Claims, 3 Drawing Sheets

METHODS FOR BARRIER LAYER FORMATION

FIELD OF THE INVENTION

The present invention generally relates to the fabrication of microelectronic semiconductor devices. More particularly, the invention relates to an improved barrier layer formation process.

BACKGROUND OF THE INVENTION

Microelectronic devices having conductive features, such as via plugs, metal lines, and the like, and methods for forming the devices are generally known. The conductive features of the microelectronic devices typically include conductive material, such as metal, and a barrier material, which barrier material typically reduces unwanted diffusion of the conductive material and promotes adhesion between the conductive material and the adjacent layers of the device.

The size of microelectronic devices, components, and features has decreased to increase device integration per unit area, reduce fabrication costs associated with the device, reduce signal delay time and the like. Consequently, the associated conductive features of the devices have also generally reduced in size. The reduced conductive feature size generally increases the current density through and resistance of the conductive feature. Increased current density through metal features may increase or cause electromigration, ie., the mass transport of metal due to the current flow. Electromigration may cause short circuits where the metal accumulates, opens where the metal has been depleted, or other device failures. Similarly, increased conductive feature resistance may cause unwanted device problems such as excess power consumption or heat generation. Therefore, materials with lower resistivity, which are also less susceptible to electromigration, are desirable.

Typical conductive materials used to form microelectronic conductive features include tungsten, aluminum, and aluminum alloys typically containing a small amount of copper. Recently, however, materials such as copper, which have lower resistivity and are more resistant to electromigration than tungsten, alumninum, and aluminum alloys, have been proposed as alternate conductive materials in microelectronic fabrication.

Although conductive features including copper or similar materials are generally advantageous because they may have lower resistance and may be less susceptible to electromigration for a given feature size, these conductive features may suffer from several shortcomings. For example, conductive features including copper may be relatively difficult to form using conventional microelectronic device fabrication techniques. In particular, copper is relatively difficult to etch using now known wet or dry processes because it does not readily form soluble or volatile compounds when exposed to conventional etching reactants. Consequently, conductive features including copper are typically formed using damascene processing, wherein the feature is formed by creating trenches or vias on the wafer surface, depositing material onto the wafer surface and into trenches and vias, and removing the material from the top surface of the wafer, leaving trenches and vias filled with conductive material. If the conductive feature also includes barrier material, the barrier material may be deposited onto the wafer surface prior to conductive material deposition, and removed from the wafer surface subsequent to conductive material removal from the surface.

Copper features formed in accordance with prior art techniques may also be disadvantageous because copper diffuses relatively rapidly through typical barrier layers used in microelectronic fabrication, such as titanium or combinations of titanium and titanium nitride, and other device layers such as silicon and oxides and nitrides thereof. In addition, copper may degrade electrical performance or cause current leakage between interconnect features or in the microelectronic device if the copper diffuses to active areas of the device. Consequently, features formed of copper and the like may require relatively thick layers of titanium, titanium nitride, or combinations thereof to prevent the diffusion of copper to other device regions. Relatively thick barrier layers may negate most if not all of the advantages associated with using low resistivity conductive material because, in part, the barrier layer typically has higher resistivity than the copper, and the effective resistance of the conductive feature typically increases as the barrier material film thickness increases. Nevertheless, titanium-based diffusion barriers are often used in device fabrication-because the films are relatively easy to remove using standard copper chemical mechanical polishing processes and these layers provide adequate adhesion between the conductive material and the wafer surface.

Alternative diffusion barrier layers such as those formed from tantalum, tantalum nitride, and the like, may also be used to prevent or reduce diffusion of copper or similar materials. Generally, these materials are more resistant to copper diffusion than the titanium-based layers (for a given thickness). However, the tantalum films are generally more difficult to remove from the surface of the wafer than the titanium-based layers. In particular, copper chemical mechanical polishing processes generally remove copper and titanium-based films at a rate which is typically greater than the rate of tantalum removal. Consequently, as tantalum is removed from the wafer surface, copper material below the surface of the wafer (e.g. in the vias and trenches) is often removed, causing dishing in the copper features. The dishing of the copper features may deleteriously affect the performance of the microelectronic device, because the amount of copper in the via or trench determines the effective feature cross section for current flow. As the effective cross section decreases, the current density and resistance of the feature generally increase.

In addition, because tantalum is difficult to remove from the surface of the wafer using typical copper chemical mechanical polishing processes, an aggressive polishing process may be employed to remove the tantalum. The aggressive process may cause unwanted scratching and erosion of dielectric or other films on the surface of the wafer.

To reduce the amount of dishing and scratching that occurs during the last phase of CMP (over polishing), a two-step polishing process may be used to remove the conductive and barrier layers, respectively. In particular, a first polishing step, which removes the conductive material at a relatively high rate, may be used to remove most of the conductive material and a second polishing step, which removes tantalum at a relatively high rate and conductive material at a relatively low rate, may be used to remove the barrier layer on the wafer surface. However, two-step processes generally add complexity and increase wafer fabrication and device costs.

Therefore, microelectronic conductive features that overcome the shortcoming of prior art conductive features and methods for forming the features are desired. In particular, conductive features with low resistivity and high resistance to electromigration, which are relatively easy and inexpensive to manufacture are desired.

SUMMARY OF THE INVENTION

The present invention provides a microelectronic device having an improved conductive feature and methods for forming the device. The conductive feature is generally formed by forming a trench or via on the surface of a wafer, depositing a barrier material on the side walls and bottom of the trench or via, removing any barrier material from the wafer surface and filling the via or trench with conductive material.

While the way in which the present invention addresses the drawbacks of now known conductive features will be described in greater detail below, in general, in accordance with various aspects of the present invention, the inventive conductive feature has relatively low resistivity, is relatively resistant to electromigration, and is relatively easy to form.

In accordance with the present invention, the conductive feature includes a tantalum-based barrier film and a copper-based conductive material.

In accordance with other aspects of present invention, the barrier film is deposited using directed deposition methods such as ionized metal plasma deposition, hollow cathode metal deposition, or similar techniques which can deposit the barrier material substantially within the trench or via on the surface of the wafer.

In accordance with other aspects of present invention, the barrier film is deposited using anisotropic deposition techniques such as high density plasma deposition processes, high current arc evaporation or similar techniques which can deposit the barrier material substantially within the trench or via on the surface of the wafer.

In accordance with other aspects of the present invention, barrier or adhesion material may be removed from the wafer surface prior to depositing conductive material onto the conductive vias or trenches and the wafer surface.

In accordance with yet further aspects of the present invention, the device may include a sacrificial layer that may be used to prevent surface damage to the wafer during barrier material removal.

BRIEF DESCRIPTION OF THE DRAWINGS

A more complete understanding of the present invention may be derived by referring to the detailed description and claims when considered in connection with the figures, wherein like reference numbers refer to similar elements throughout the figures, and:

DETAILED DESCRIPTION OF PREFERRED EMBODIMENTS

The present invention generally relates to an improved microelectronic device having at least one conductive feature and to methods for forming the device. Although the inventive device may include a variety of forms and perform a variety of functions, the present invention will conveniently be described hereinbelow in connection with a device formed on a semiconductor wafer. The wafer may include various conducting, semiconducting, insulating, and semi-insulating layers.

Figure 1:
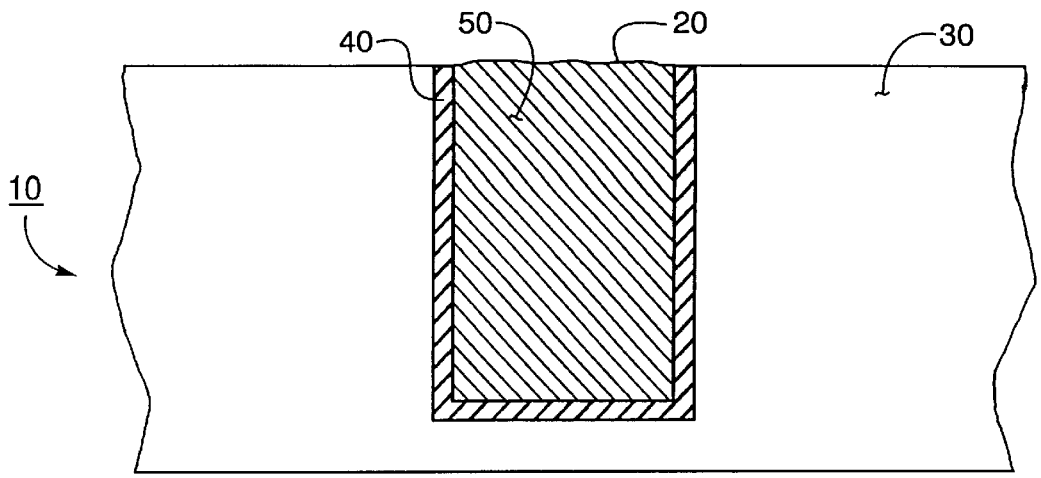
FIG. 1 is a cross-sectional view of a device including a conductive feature in accordance with the present invention.

Referring now to FIG. 1, a semiconductor device 10 including a conductive feature 20 surrounded by an insulating material 30 in accordance with a preferred embodiment of the present invention is shown. As discussed in more detail below, various devices 10 in accordance with the present invention may also include additional layers or films such as, for example, sacrificial adhesion or polishing stop layers to assist device fabrication.

Insulating material 30 of device 10 may include any material that suitably prevents conductive features from unwanted shorting between feature 20 and other conducting or semiconducting structures of device 10. Preferably, insulating material 30 includes dielectric material, and in especially preferred embodiments of the present invention, insulating material 30 includes silicon oxides, silicon nitrides, doped oxides, or combinations thereof.

Conductive feature 20 of device 10 may be configured to perform various device 10 functions such as connecting various conducting or semiconducting layers or components of device 10. For example, feature 20 may be a metal plug connecting various conducting or semiconducting layers of device 10, a metal line connecting various electronic components of device 10 located on the same layer, and the like.

While feature 20 may include a variety of components and films, in accordance with a preferred embodiment of the present invention, conductive feature 20 preferably includes conductive material 50 and a barrier material 40 configured to reduce unwanted difflusion of conductive material 50. Conductive material preferably provides a low resistivity conductive path for device 10.

Barrier material 40 of conductive feature 20 is preferably configured to prevent diffuision, promote preferred grain structure, promote preferred texture, and the like of conductive material 50 to insulating material 30 or other regions of device 10. Accordingly, the composition of barrier material 40 often depends, at least in part, on the composition of conductive material 50. In addition, barrier material 40 may be chosen such that it promotes adhesion between conductive material 50 and insulating material 30; thus the composition of barrier material 40 may also depend on the composition of insulating material 30.

In preferred embodiments of the present invention, barrier material 40 includes tantalum, tantalum nitride, or combinations thereof to promote adhesion between conductive material 50 and insulating material 30 and minimize diffusion of conducting material 50 to insulating material 30 and other device areas. While the preferred thickness of barrier material 40 may depend on the particular configuration of feature 20 or the specific application of device 10, in general, the thickness of barrier metal 40 is chosen such that material 40 will prevent unwanted conductive material 50 diffusion while not significantly contributing to the resistance of feature 20. Typically, barrier material 40 has a higher resistivity than conducting material 50; therefore, barrier material 40 is often desirably only as thick as necessary to prevent unwanted difflusion, with some margin of safety. In a particularly preferred embodiment of the present invention, barrier material is typically about 25 to 500 Å thick and more preferably about 250 Å thick.

Conductive material 50 is preferably composed of materials having low resistivity, and the materials are also preferably resistant to electromigration. Preferably, conductive material 50 includes metals, and more preferably, conductive material 50 includes copper and/or copper alloys.

Figure 2:
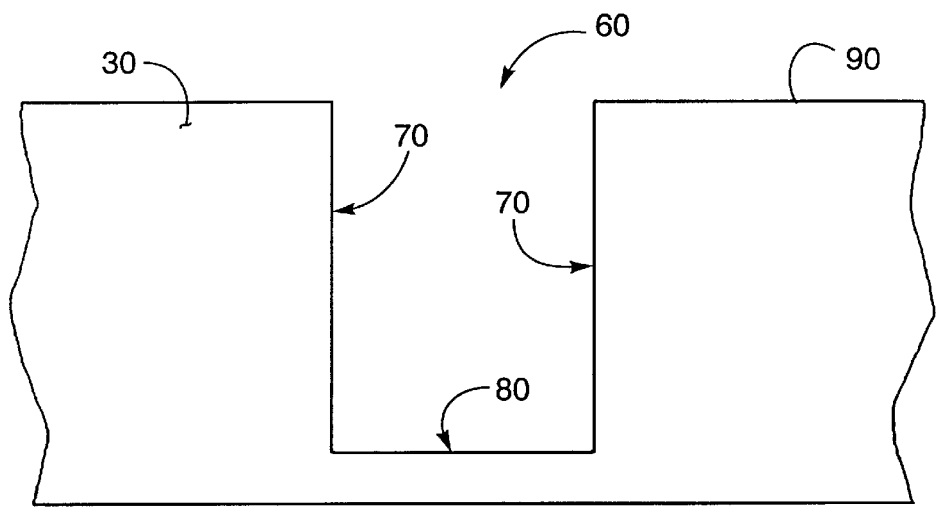
FIG. 2 is a cross-sectional view of a device including a trench formed on a wafer surface.

Referring now to FIG. 2, conductive feature 20 of device 10 is typically formed by creating a depression such as a trench or via 60, including sidewalls 70 and a bottom 80, in insulating material 30. Although the following description relates to trench 60, the same techniques can be equivalently applied to vias. Trench 60 is generally formed by depositing insulating material 30 onto the wafer surface and etching trench 60 into insulating material 30. Insulating material 30 may be deposited by any method now known or hereafter developed by those skilled in the art such as thermal or plasma-enhanced chemical vapor deposition and the like. Trench 60 may then be formed by using photo resist or the like to pattern a surface 90 and exposing patterned openings of surface 90 to reactants that form soluble or volatile products. In a particularly preferred embodiment of the present invention, trench 60 is formed by exposing patterned wafer surface 90 to a dry chemical etch such as a fluorine-based etch, for example, a $C_4F_8/CF_4$ etch.

According to preferred embodiments of the present invention, feature 20 is formed in a manner which requires minimal removal of barrier material 40 subsequent to the removal of conductive material 50. Therefore, as described in more detail below, preferred methods of forming device 10 include either minimal to no deposition of barrier material 40 onto surface 90, removal of barrier material 40 prior to conductive material deposition, or the like.

Figure 3:
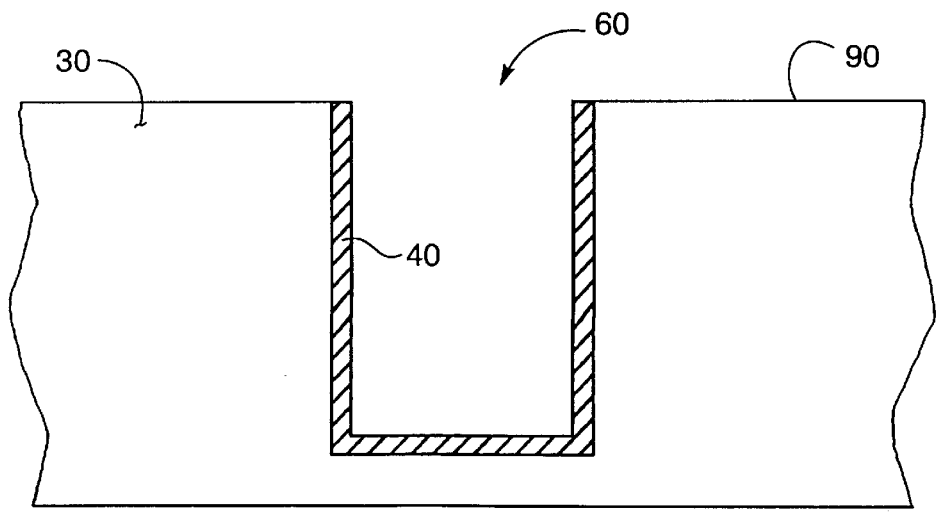
FIG. 3 is a cross-sectional view of the device of FIG. 2 with barrier material deposited within the trench.

Referring now to FIG. 3, in accordance with a preferred method of the present invention, barrier material 40 is deposited substantially only within trench 60 during device 10 formation. In other words, little to no barrier material is deposited onto surface 90 during material 40 deposition onto surfaces 70, 80 of trench 60.

One method for depositing material substantially only within trench 60 includes anisotropic deposition processes which simultaneously deposit and etch material such as barrier material 40. For example, high density plasma deposition processes, high current arc evaporation (HCAE), and the like may be used to deposit barrier material 40 substantially within trench 60. HCAE deposition allows deposition of barrier material 40 onto sidewalls 70 and bottom 80 of trench 60 with little to no sputtering or material deposition on surface 90 of the wafer. Consequently, little to no material 40 need be removed from surface 90 during the formation of device 10. With HCAE and similar processes, both deposition and etching may simultaneously occur near surface 90 during deposition of material 40 onto the surfaces of trench 60. Deposition may occur primarily as a result of thermal chemical vapor deposition or physical vapor deposition such that material is deposited near or onto surface 90 in a substantially isotropic manner while the etch process may be affected by ions in the plasma such that it removes material in a substantially anisotropic manner (e.g., on or near surface 90 only). In other words, the etch rate parallel to the unobstructed surface 90 must be greater or equal to the deposition rate to surface 90, and the deposition rate onto sidewalls 70 must be greater than the corresponding etch rate.

Figure 4:
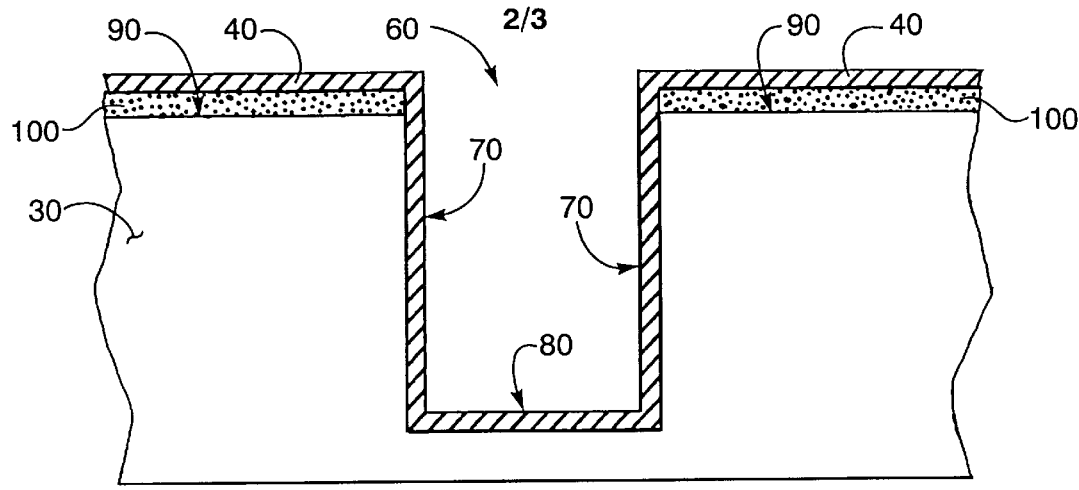
FIG. 4 is a cross-sectional view of a device including a trench coated with barrier material in accordance with an alternate embodiment of the present invention.

Referring now to FIG. 4, in accordance with an alternate embodiment of the present invention, barrier material 40 may be initially deposited over surface 90 and trench 60 and subsequently removed from surface 90 prior to the deposition of conductive material 50. After the removal of barrier material 40 from surface 90, sidewalls 70 and bottom 80 of trench 60 remain coated with barrier material 40 as shown in FIG. 3. In accordance with this embodiment of the present invention, barrier material 40 may be deposited onto the wafer surface using a variety of techniques such as HCAE (described above), chemical vapor deposition, physical vapor deposition including directional deposition methods such as ionized plasma metal deposition (IMP) and hollow cathode metal deposition (HCM), or the like.

If barrier material 40 is deposited and removed from surface 90, a sacrificial polishing stop layer 100 may be deposited onto surface 90 of the wafer to prevent damage to surface 90 during removal of barrier material 40. Sacrificial layer 100 may then be removed prior to the deposition of conductive material 50. Sacrificial layer 100 may include any material that may be removed from surface 90 of the wafer. In accordance with preferred embodiments of the present invention, sacrificial layer includes approximately 50 to 1000 Å of dielectric material. In accordance with preferable embodiments of the present invention, dielectric material may include oxides, nitrides, any combination thereof, and the like. Preferably, layer 100 includes silicon nitride.

After trench 60 has been formed, coated with barrier material 40 and, if necessary, barrier material 40 removed wafer surface 90, conductive feature 20 may be formed by filling the remaining volume of trench 60 with conducting material 50.

Figure 5:
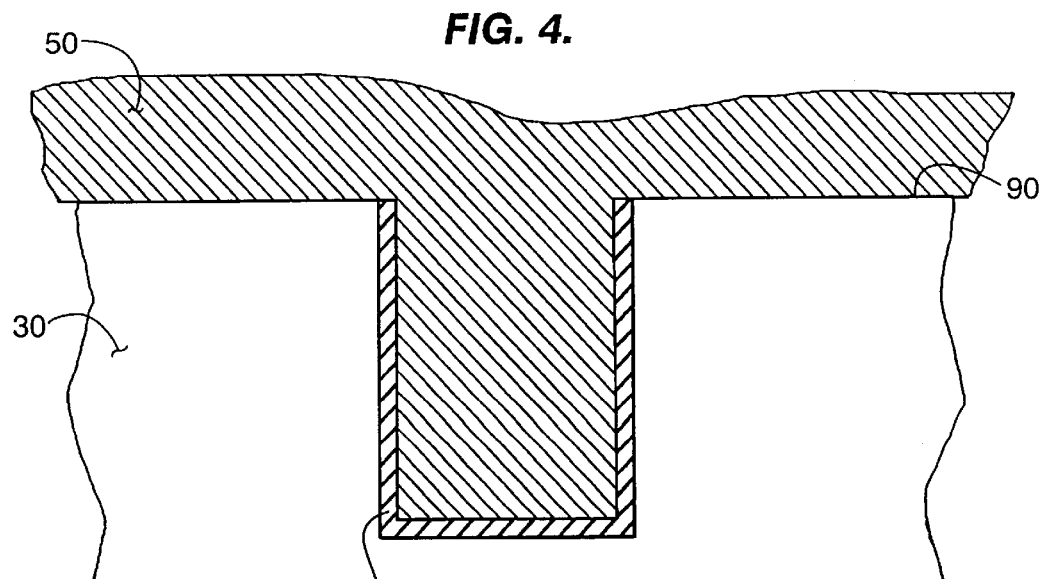
FIG. 5 is a cross-sectional view of the device of FIG. 3 with conductive material deposited over a wafer surface.

Referring now to FIG. 5, in accordance with a preferred embodiment of the present invention, trench 60 is filled with conductive material 50 by depositing material 50 over surface 90 and trench 60 of the wafer. Preferably, enough material 50 is deposited onto the wafer surface to fill trench 60, and more preferably, to overfill trench 60 to ensure that trench 60 is substantially filled with material 50 after material 50 is removed from surface 90.

To form conductive feature 20, as shown in FIG. 1, material 50 is removed from surface 90 of the wafer. Material 50 may be removed by any method now known or hereafter devised by those skilled in the art; however, according to preferred methods of the present invention, material 50 is removed from surface 90 using chemical mechanical polishing. Typically, all of material 50 and a portion of material 30 are removed from surface 90 such that surface 90 is substantially insulative, that is non-conducting.

Because barrier material 40 is either not deposited onto surface 90 or is removed prior to material 50 deposition and removal, damage to surface 90 (that may otherwise result from the removal of material 40) is reduced or minimized. Also, dishing of feature 20 caused during the removal of material 40 is reduced. However, some overpolishing may be generally performed to ensure that all conductive material 50 has been removed from surface 90 of the wafer; consequently, a small amount of dishing or polishing of feature 20 below surface 90 may occur as a result of this technique.

Figure 6:
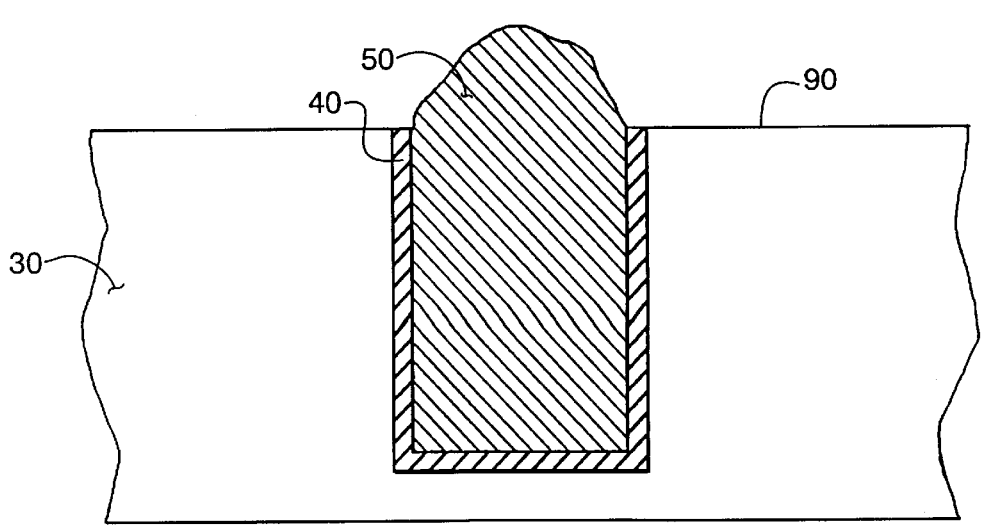
FIG. 6 is a cross-sectional view of the device of FIG. 3 with conductive material deposited within the trench in accordance with an alternate embodiment of the present invention.

Referring now to FIG. 6, in accordance with an alternate embodiment of the present invention, conductive material 50 may be selectively deposited into trench 60, such that little to no material 50 is deposited onto surface 90. For example, material 50 may include copper that may be deposited within trench 60 using electroless plating, electrolytic plating, or the like. To ensure adequate filling of trench 60, excess material 50 may be deposited, as shown in FIG. 6. Any excess conductive material 50 may be removed using chemical mechanical polishing or any suitable removal technique.

Forming feature 20 in accordance with the embodiment illustrated in FIG. 6 may be particularly advantageous because little to no polishing is required to remove excess conductive material 50. Consequently reduced dishing of conductive material 50 and/or reduced defect formation on surface 90 may result from the polishing process.

Figure 7:
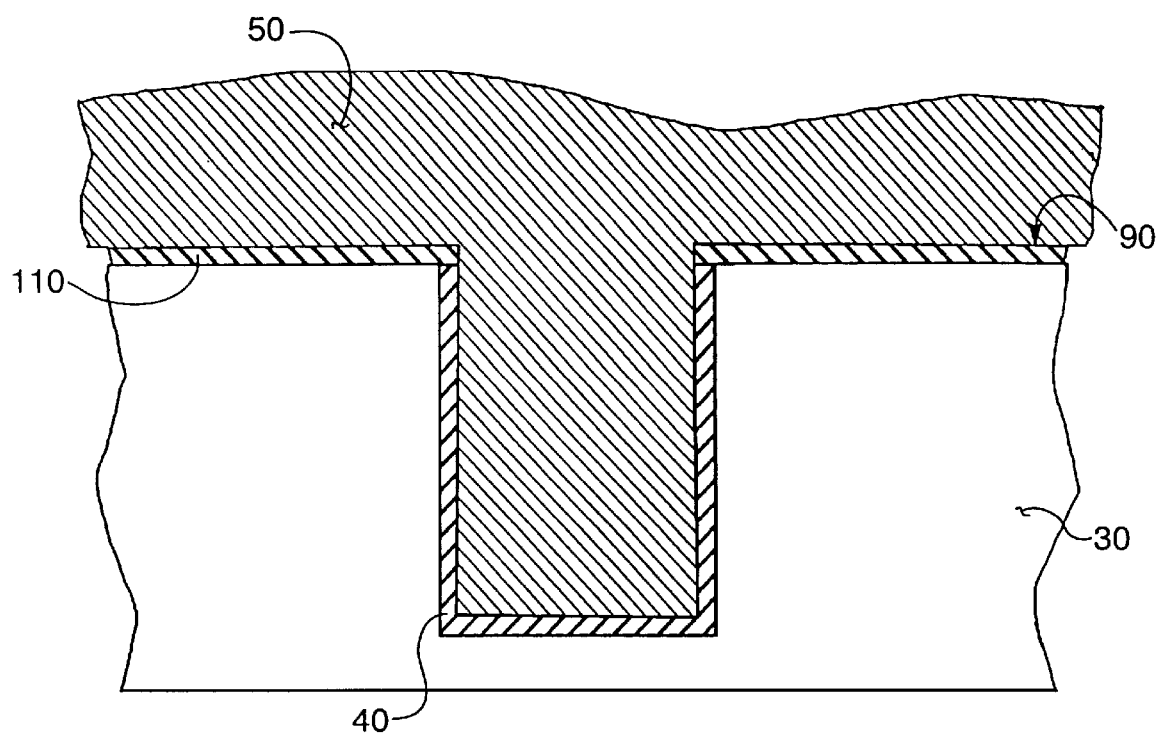
FIG. 7 is a cross-sectional view of a device including an adhesion layer in accordance with an alternate embodiment of the present invention.

Referring now to FIG. 7, in accordance with yet another embodiment of the present invention, an adhesion layer 110 may be used to promote adhesion between surface 90 and conductive material 50 such that conductive material 50 will not peel or delaminate during chemical mechanical polishing of material 50. Adhesion layer 110 may then be removed by etching, polishing, or the like to form feature 20 as shown in FIG. 1.

Adhesion layer 110 may include any material that promotes adhesion between surface 90 and material 50. For example, adhesion layer may be formed from the same material as barrier material 40 (such as tantalum) or from other suitable materials such as titanium, titanium nitride, any combination thereof, and the like. Preferably, adhesion layer 110 includes about 25 to 500 Å of titanium, titanium nitride or a combination of titanium and titanium nitride films.

Adhesion layer 110 may be deposited after barrier material 40 is deposited to form the device shown in FIG. 7, or prior to the deposition of material 40 (not shown in the figures). Layer 110 may be removed from surface 90 using a variety of processes. For example, layer 110 may be removed from surface 90 using wet or dry chemical etch processes. Alternatively, layer 110 may be removed using chemical mechanical polishing, which polishing process may be the same process used to remove material 50.

The terms top, bottom, and the like have been used throughout this application to refer to various directions or portions of the device. These terms are used for reference to the drawing figures only and are not meant to limit possible configurations of the device described hereinabove. In addition, although the present invention is set forth herein in the context of the appended drawing figures, it should be appreciated that the invention is not limited to the specific forms shown. For example, the device may include various numbers of conductive serniconductive, insulative, and semi-insulative layers, depending on the intended device application or design. Also, the device may include various combinations of films described above. For example, the device may include polishing stop layers, adhesion layers, or any. combination of these layers. Various other modifications, variations, and enhancements in the design and arrangement of the device as set forth herein may be made without departing from the spirit and scope of the present invention as set forth in appended claims.

What is claimed is:

1. A method for forming a microelectronic device on a wafer, the method comprising the steps of:

depositing an insulating material on a surface of the wafer;

forming a depression having an opening within said insulating material, wherein said opening of said depression is defined by a surface of said insulating material;

depositing a barrier material into said depression;

depositing a conductive material onto and in contact with said barrier material and said insulating material; and removing an excess amount of said conductive material that extends beyond said surface of said insulating material.

2. The method of claim 1, wherein said barrier material comprises tantalum.

3. The method of claim 1, wherein said barrier material comprises tantalum nitride.

4. The method of claim 1, wherein said conductive material comprises copper.

5. The method of claim 1, wherein said removing step comprises the step of performing a chemical mechanical polishing procedure.

6. The method of claim 1, wherein said barrier material depositing step comprises the step of performing a directional deposition process.

7. The method of claim 1, wherein said barrier material depositing step comprises the step of performing a anisotropic deposition process.

8. The method of claim 1, further comprising:

depositing barrier material onto said insulating material surface; and removing said barrier material from said insulating material surface.

9. The method of claim 8, wherein said barrier material removal step comprises the step of performing a chemical mechanical polishing procedure.

10. A method for forming a microelectronic device on a wafer, the method comprising the steps of:

forming a depression within a material layer of said wafer;

adding a sacrificial layer onto an upper surface of said material layer;

depositing a barrier material into said depression and over said sacrificial layer;

depositing conductive material into said depression and above and in contact with said sacrificial layer; and removing excess materials that extend beyond said upper surface.

11. The method of claim 10, further comprising the step of removing said sacrificial layer.

12. The method of claim 10, wherein said sacrificial layer comprises silicon nitride.

13. The method of claim 10, wherein said sacrificial layer comprises an adhesion layer.

14. The method of claim 13, wherein said adhesion layer comprises titanium.

15. The method of claim 13, wherein said adhesion layer comprises titanium nitride.

* * * * *